(12) United States Patent
Japp et al.

(10) Patent No.: US 6,613,413 B1
(45) Date of Patent: Sep. 2, 2003

(54) POROUS POWER AND GROUND PLANES FOR REDUCED PCB DELAMINATION AND BETTER RELIABILITY

(75) Inventors: Robert M. Japp, Vestal, NY (US); Mark D. Poliks, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/300,762

(22) Filed: Apr. 26, 1999

(51) Int. Cl.[7] .......................... B32B 3/10; B32B 15/00; B32B 3/00; B32B 7/00; H05K 1/11; H05K 1/23; H05K 1/09; H05K 1/02; H05K 1/14; H05K 7/02; H05K 7/06; H05K 7/08

(52) U.S. Cl. .................. 428/131; 428/901; 428/209; 428/291.4; 174/255; 174/261; 174/262; 174/263; 174/264; 174/265; 174/266; 174/256; 174/257; 174/258; 174/259; 361/780; 361/792; 361/793; 361/794

(58) Field of Search ................. 428/901, 131, 428/209, 291.4; 174/255, 261, 262–266, 256–259; 361/780, 792–794

(56) References Cited

U.S. PATENT DOCUMENTS

| | | | |
|---|---|---|---|
| 3,161,945 A | | 12/1964 | Anderson et al. |
| 3,276,106 A | * | 10/1966 | Bester et al. ............... 174/256 |
| 3,617,613 A | * | 11/1971 | Benzinger et al. ......... 174/68.5 |
| 4,169,911 A | * | 10/1979 | Yoshida et al. ............... 428/36 |
| 4,496,793 A | * | 1/1985 | Hanson et al. ............. 174/68.5 |
| 4,572,925 A | * | 2/1986 | Scarlett ...................... 174/257 |
| 5,027,255 A | * | 6/1991 | Zeitlin et al. ............... 361/395 |
| 5,316,837 A | | 5/1994 | Cohen |
| 5,372,872 A | | 12/1994 | Funada et al. |
| 5,571,608 A | | 11/1996 | Swamy |
| 5,574,630 A | * | 11/1996 | Kresge et al. ............... 361/792 |
| 5,662,816 A | | 9/1997 | Andry |
| 5,972,053 A | * | 10/1999 | Hoffarth et al. ........... 29/25.03 |
| 6,242,078 B1 | * | 6/2001 | Pommer et al. ............ 174/250 |
| 6,337,463 B1 | * | 1/2002 | Gaku et al. ............ 219/121.61 |

FOREIGN PATENT DOCUMENTS

| | | |
|---|---|---|
| EP | 0 373 363 A2 | 11/1989 |
| EP | 0 393 312 A1 | 2/1990 |
| EP | 0 949 854 A1 | 10/1999 |
| FR | 2 694 139 | 7/1992 |
| GB | 0 228 017 A2 | 7/1987 |
| GB | PCT/GB 00/01119 | 3/2000 |
| JP | 0 392 082 | 11/1989 |
| JP | 02-071587 | 3/1990 |
| JP | 06-177547 | 6/1994 |
| JP | 06-350254 | 12/1994 |
| JP | 07-212043 | 8/1995 |
| JP | 07-302979 | 11/1995 |
| WO | WO98/26639 | 6/1998 |

OTHER PUBLICATIONS

2244 Research Disclosure, (1989) Sep., No. 305, New York, US, Thermal Expansion Controlled Ground and Voltage Planes, p. 665.

* cited by examiner

Primary Examiner—Harold Pyon
Assistant Examiner—Patricia L. Nordmeyer
(74) Attorney, Agent, or Firm—Schmeiser, Olsen & Watts; Arthur J. Samodovitz

(57) ABSTRACT

Power and ground planes used in Printed Circuit Boards (PCBs) having porous, conductive materials allow liquids (e.g., water and/or other solvents) to pass through the power and ground planes, thus decreasing failures in PCBs (or PCBs used as laminate chip carriers) caused by cathodic/anodic filament growth and delamination of insulators. Porous conductive materials suitable for use in PCBs may be formed by using metal-coated organic cloths (such as polyester or liquid crystal polymers) or fabrics (such as those made from carbon/graphite or glass fibers), using metal wire mesh instead of metal sheets, using sintered metal, or making metal sheets porous by forming an array of holes in the metal sheets. Fabrics and mesh may be woven or random. If an array of holes is formed in a metal sheet, such an array may be formed with no additional processing steps than are performed using conventional PCB assembly methods.

28 Claims, 5 Drawing Sheets

POROUS POWER AND GROUND PLANES FOR REDUCED PCB DELAMINATION AND BETTER RELIABILITY

RELATED APPLICATION

This application is related to a copending patent application by Japp et al., entitled "LOW CTE POWER AND GROUND PLANES", Pat. No. 6,329,603 allowed Dec. 11, 2001, and is incorporated herein by reference.

BACKGROUND OF THE INVENTION

1. Technical Field

The present invention relates generally to the field of computer manufacturing and more specifically to reducing delamination of, and cathodic/anodic filament growth on, boards used in computers.

2. Background Art

Computers and similar electronic equipment have become ubiquitous elements in the lives of people. Many businesses, banks, and governments rely on computers for their everyday activities. A large portion of the global community require that computers be reliable, stable facets of their economic, societal, and communication foundations. Computers today are required to run longer, with less down-time, than at any time in the past.

Because computers are so necessary, there has been an increased emphasis by computer designers on reliability. Many systems today cannot tolerate the extended down time necessary to replace failed components that make up the computer system. If each component is designed to last longer and be more reliable, then each computer, which is made exclusively of components, will last longer and be more reliable.

This emphasis on reliability of components has been applied to Printed Circuit Boards (PCBs). Most components in a computer system are designed by placing semiconductor packages or chips onto a PCB. PCBs are called "printed" because circuit runs or lines of copper are placed on the boards using techniques that were originally similar to the news print process. These circuit lines connect the semiconductor packages or chips together. PCBs can be as simple as an insulator that has lines printed on one or both sides and one or more components attached to one or both sides. PCBs are generally more complex, however, and are usually made of conductive, metal power and ground planes and several signal planes containing circuit lines sandwiched between layers of insulator, with metal lines and pads on the top and bottom surface of the sandwich. Top and bottom conductors are connected with each other and internal circuit layers using metal plated through holes (PTHs).

PCBs made in this manner have become the standard in electronics. Advances in manufacturing methods have made PCBs relatively inexpensive yet their simplicity makes them reliable. There are, however, problems associated with PCBs. One of the causes of some of these problems is water. The insulators in PCBs tend to be water permeable and to naturally absorb relatively high concentrations of water. Even if a PCB was dry when the component assembly process was completed, it may soon reabsorb water from humid air or through other processing steps. Thus, PCBs contain water, and this water freely permeates through insulating layers. Unfortunately, power and ground planes, which are usually made of copper metal, are not water permeable.

This lack of permeability affects PCBs and can cause failures. Water collects at the interface between a power/ground plane and the insulating layers, which sandwich the power/ground plane. The chips, chip carrier packages, or other components are soldered to the PCB (usually by wave soldering or infrared heat). These temperature increases can cause water that has collected at interfaces between the power/ground plane and the insulating layers to flash to steam. Water increases in volume dramatically as it becomes steam, and this expanding water/steam mixture can cause delamination of the insulator. In fact, "blisters" can appear in the surface of the insulator, leading to cracking of the insulator, line breakage, package ruptures, cracked PTH barrels, and other similar deleterious effects.

For the water to "escape" the confines of the insulator, the water must diffuse through the insulator to an area of lower water concentration. This area of lower water concentration generally only occurs at the periphery of the PCB including the top and bottom surfaces, where the laminate layers meet air. Assuming that the air actually has lower concentrations of water, diffusion of water through the dielectric into the atmosphere will occur over a long time. Until water has been removed from the PCB, however, the water can cause blister damage.

Another water-caused failure mechanism in PCBs is cathodic-anodic filament growth (CAF), which occurs when circuit board shorts grow along glass fibers. The shorts are formed when water leaches metal ions from adjacent conductors into the interface between a glass fiber and the dielectric. The copper ions are deposited when an electrical bias is applied; this deposition tends to form conductive dendrites. When the material is in solution, it is generally ionic so that it will migrate toward a metal feature that is oppositely charged. Cathodes are positively charged areas, while anodes are negatively charged areas. Thus, metal dendrites usually grow between two oppositely charged, local cathodic/anodic regions. These conductive metal dendrites then cause electrical shorts.

The failure mechanisms caused by water have been exacerbated somewhat by the use of PCBs for chip carriers. Chip carriers are devices to which chips are placed and connected before being connected to a board. In the past, these chip carriers were made almost exclusively of ceramics. Because of the use of ceramics for chip carriers, the Joint Electronic Device Engineering Council (JEDEC), a body organized to promulgate standards for electronic manufacturing, devised testing standards for chip carriers that essentially assume that the base substrate material absorbs no water at all. Now that PCBs have begun to be used in chip carriers, water migration and the problems associated therewith are more prevalent because there is simply more water in these organic materials. Chip carriers, which are made from organic laminate materials, are called laminate chip carriers (LCCs).

Therefore, without a way to limit failures caused by cathodic/anodic dendrite growth and delamination of insulators in organic LCCs, PCBs and LCCs will continue to have higher numbers of failures and reliability problems.

DISCLOSURE OF INVENTION

Accordingly, the embodiments of the present invention provide power and ground planes that are used in printed circuit boards (PCBs) and that comprise porous, conductive materials. Porous power and ground plane materials allow water and/or other solvents to pass through the power and ground planes, thus decreasing failures in PCBs (or PCBs used as laminate chip carriers) caused by cathodic/anodic filament growth and delamination of insulators. Porous conductive materials may be formed by using metal-coated cloths (such as polyester) or fabrics (such as those made from carbon/graphite or glass fibers), using metal wire mesh instead of metal sheets, using sintered metal, or making metal sheets porous by forming an array of holes in the metal sheets. Metal mesh or fabric may be made in woven or random paper configurations. If an array of holes is formed in a metal sheet, such an array may be formed with no additional processing steps than are performed using conventional methods.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
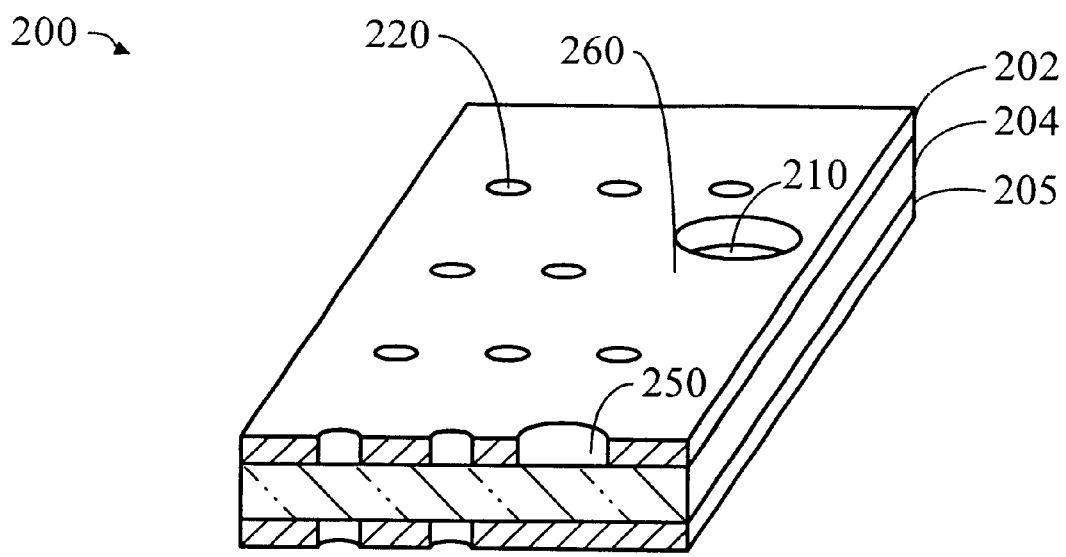
FIG. 1 is a perspective view of a cross-section of a power core patterned in accordance with a preferred embodiment of the present invention.

The preferred embodiments of the present invention overcome the limitations of the prior art by providing Printed Circuit Boards (PCBs) having conductive, porous materials for power and ground planes. The materials are preferably porous to water and other solvents. The present invention relates to manufacturing of PCBs. A short introduction to general manufacturing techniques for PCBs will now be given, followed by the preferred embodiments.

Printed Circuit Boards

In order to make a printed circuit board, the starting material is usually a sheet consisting of fiberglass and epoxy resin. This is often termed "prepreg" because the fiber is impregnated with resin during preliminary processing. The resin essentially acts a binder to bind fiber into a board. In place of the fiberglass cloth, it is possible to use compressed paper or other suitable materials. The basic board is therefore a flat, rigid or lightly flexible dielectric material that will be fabricated into the final printed circuit. This starting material can be laminated with a thin layer of copper on both sides of the board with suitable adhesion. The combination is commonly called copper clad laminate (CCL). These CCLs can either become simple double sided boards (having two sides of copper lines) or they can be circuitized and laminated with additional dielectric into multilayer composites.

In most cases, holes are provided through these boards (usually by drilling) to accommodate electrical connection of the various electronic components that will be attached. The holes are usually drilled using high speed drilling machines and the locations of the holes are specified in the drawings or design for the boards.

In order to make an electrical connection from one side of the copper laminate through the holes to the other side, the plastic wall of the hole must be made conductive. This is accomplished by a chemical process commonly known in the industry as metallization, and the process consists of a relatively complicated series of chemical tanks and rinses and an activating step to apply a thin copper layer to the hole walls.

Since the copper layer formed by the metallizing process is generally too thin to form a suitable electrical bridge between the two layers of the board, copper electroplating is used to deposit a heavy layer of copper in the holes in order to form a suitable copper cross section for carrying current. Copper plating can be followed by. tin-lead or tin plating in order to improve solderability.

After metallization, circuitization is performed on those surfaces that require circuit patterns. The circuit pattern is a circuit design that is applied to the metal surface of the drilled board in accordance with the requirements of the specifications or design. The image can be formed by applying an organic photoresist coating applied as a dry film. Ultraviolet (UV) light is projected through a mask onto the photoresist. The mask contains shapes that block the UV light. For negative photoresist, the areas of the photoresist that are not exposed to the UV light are removed during the subsequent development step. Chemical etching is then used to remove the exposed surface metal. Next, the remaining photoresist is stripped, leaving only the metal pattern.

Figure 6:
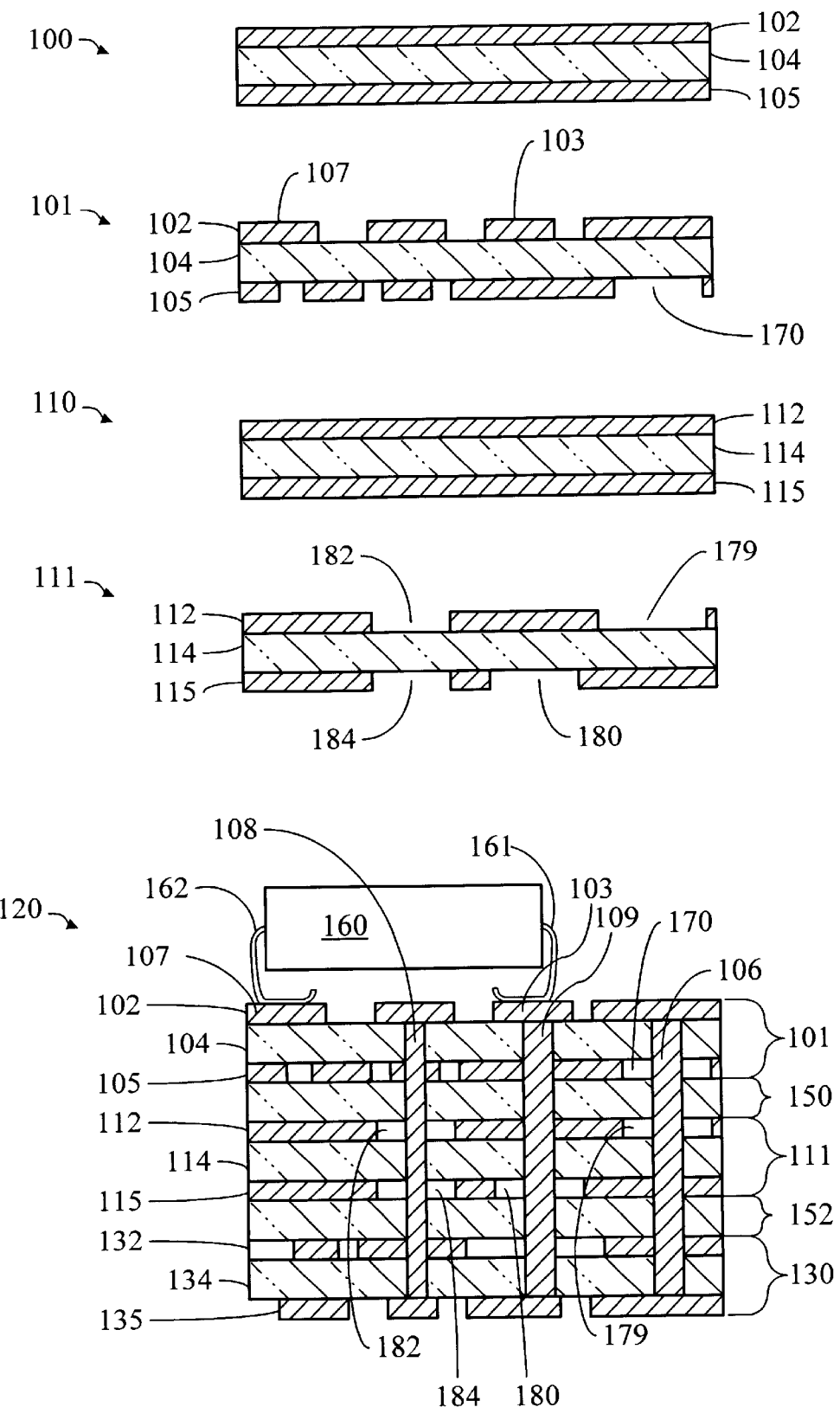
FIG. 6 contains cross-sectional views of a six-layer printed circuit board and the layers that make up a six-layer printed circuit board.

Turning now to FIG. 6, an example of a six-layer PCB and the layers that make up the six-layer PCB are shown. In FIG. 6, portions of a PCB are shown at various manufacturing stages. Six-layer PCB 120 comprises a "composite" formed by pressing (called "laminating") together two signal cores 101 and 130, one power core 111, and dielectric layers 150 and 152. The cores are individually patterned and then pressed to form a composite PCB. During this pressing, the dielectric will reflow into any gaps that exist between the cores and dielectric layers. After pressing, the composite will be drilled, epoxy smeared onto exposed drilled copper layers will be removed, through holes will be plated, and further processing performed. For simplicity, FIG. 6 shows dielectric reflow areas as containing air instead of dielectric. In addition, plated through holes (PTHs) are shown as solid metal, although these will generally be cylindrical metal holes. Finally, tooling holes, which are used to align artwork to the laminate and the layers together, are not shown.

Signal core 100 comprises a dielectric layer 104 sandwiched between two copper layers 102 and 105. Signal core 100 is a CCL on which no processing has been performed. Copper layers 102 and 105 will be signal carrying layers on which lines of copper will be made. Copper layer 102 may also have pads to which chips or surface-mounted packages containing chips will be soldered. Signal core 101 is a representation of signal core 100 after signal core 100 has been patterned. Signal core 101 comprises copper layers 102 and 105, which have been patterned with circuitry, spacing for PTHs and other clearance/tooling holes, and dielectric layer 104. Copper layer 102 has two lines (not numbered) and two pads 107 and 103, while copper layer 105 has five lines. In addition, copper layer 105 has clearance area 170 through which a PTH will exist after signal core 101 is laminated into a composite, drilling performed, and holes plated.

Power core 110 in FIG. 6 comprises a dielectric layer 114 sandwiched between two copper layers 112 and 115. Copper layers 112 and 115 may be thicker than copper layers 102 and 104 to provide extra current carrying capability. Power core 110 is a CCL on which no processing has been performed. Copper layer 112 will become the power plane of a PCB, while copper layer 115 will become the ground plane of a PCB (or vice versa). Power core 111 is a representation of power core 110 after power core 110 has been patterned. Power core 111 comprises copper layers 112 and 115 that are now patterned and dielectric layer 114. Copper layer 112 is patterned with two clearance areas 182 and 179, while copper layer 115 is patterned with two clearance areas 184 and 180. These clearance areas will prevent the power and ground planes from contacting PTHs that will be drilled in these locations after power core 111 has been pressed into a composite and holes have been drilled and plated.

A completed PCB portion is shown as six layer PCB portion 120. It is common to call this PCB a "six layer" board because it has six conductive layers. Six layer PCB portion 120 is shown after signal cores 101 and 130, power core 111, and dielectric layers 150 and 152 have been pressed to form a composite. The composite has been drilled, epoxy smear has been removed from the holes, and the holes have been plated. In addition, components may be attached to the completed PCB. For instance, a J-leaded package 160 has been soldered to pads 107 and 103 of copper layer 102 of signal core 101. Signal core 130 is a patterned signal core similar to signal core 101. Signal core 130 comprises copper layers 132 and 135 and dielectric layer 134. Copper layers 132 and 135 have been patterned to form lines. Dielectric layer 150 has been added between power plane (copper layer) 112 of power core 111 and the copper layer 105 of signal core 101, while dielectric layer 152 has been added between ground plane (copper layer) 115 of power core 111 and copper layer 132 of signal core 130. Each dielectric layer 150, 152 may have been made from more than one layer of dielectric.

Several PTHs are shown in PCB 120. PTH 109 connects power plane 112 to J-lead 161, a line on patterned copper layer 105, and a line on patterned copper layer 135. Clearance area 180 prevents PTH 109 from shorting to ground. Note that clearance area 180 would be filled with reflowed dielectric after lamination, but this is not shown in FIG. 6 for simplicity. PTH 108 connects signal lines on copper layers 102, 105, 132, and 135. Clearance areas 184 and 182 prevent PTH 108 from contacting ground plane 115 or power plane 112, respectively. PTH 106 connects ground plane 115 with lines or pads on copper layers 135, 132, and 102.

It should be noted that electrical clearance holes, while allowing some amount of localized water to pass, do not provide sufficient porosity to moisture needed to prevent or eliminate cathodic/anodic filament growth effects or delamination. For instance, in FIG. 6, clearance area 180 will allow some water near the area to pass; however, the size of this area has been exaggerated for clarity and it will be much smaller in actual LCCs. The distance between and size of PTHs have also been exaggerated for clarity, and in reality the distances will be much larger in most areas and the size smaller. Thus, there will generally be some locations between a ground or power plane and a PTH, through which some small amount of moisture may diffuse, but these small sites near PTHs are not sufficient to provide the porosity that is necessary to prevent or reduce cathodic/anodic filament growth effects or delamination.

The insulating or dielectric materials used in PCBs are able to retain relatively high amounts of water. These materials absorb water during processing. They also have moderate diffusion constants, which allow the water to travel. Conversely, power and ground planes are generally copper, which do not allow water to pass. As the water diffuses through the insulators, the metallic power and ground planes are essentially barriers that stop diffusion. Thus, water collects at the interface of power/ground planes and dielectric layers.

Preferred Embodiments

The preferred embodiments of the present invention overcome the limitations of the prior art by providing power and ground planes that are used in Printed Circuit Boards (PCBs) (or PCBs used as Laminate Chip Carriers (LCCs)) and that contain conductive, porous materials. By providing high porosity, these power and ground plane materials allow water or other solvents to pass through the power/ground planes, thereby reducing or eliminating cathodic/anodic filament (CAF) growth and blisters caused by expanding solvent. Water is the main cause of CAF, but other solvents are known to cause delamination. In particular, trichloroethylene, methylene chloride, benzyl alcohol, and propylene carbonate are solvents that can cause delamination or bubbling effects.

The preferred embodiments comprise a variety of conductive, porous materials that may be used for the power and ground planes of PCBs. There are a number of materials available that meet the requirement of porous power and ground planes. For instance, embodiments of the current invention may be entirely metallic (metal foils with an array of holes, sintered/powdered metal, metal wire mesh, etc.), or may have fibrous base materials wherein increased conductivity is provided by metallization (carbon fiber coated with metal, glass fiber coated with metal, polyester coated with metal, etc.). Depending on the type of base conductive material used, different processes may be used to form both the small moisture diffusion holes and the functional electrical clearance holes.

Before proceeding to the preferred embodiments, a short discussion of terminology is beneficial. As stated in the Overview section, "prepreg" is a term that generally connotes fiberglass and epoxy resin. This is often termed "prepreg" because the fiber is impregnated with resin during processing. Sheets of fibrous materials may be called "fiber composites," while sheets of fibrous materials containing resin are generally called "fiber resin composites." Unfortunately, when one or more signal layers are laminated with one or more power/ground planes, or a power/ground plane is laminated between sheets of prepreg, the resulting item is called a "composite." To avoid confusing this composite structure with fiber composites or fiber resin composites, fiber composites and fiber resin composites will be called "fiber laminate." The term "fiber laminate" is intended to encompass all types of prepreg, fiber composites, fiber resin composites, dielectrics, insulators and other materials used in PCB manufacturing. Additionally, embodiments of the present invention may use conductive fiber laminates (such as prepreg infused with copper). It should be noted as well that, while the term "fiber laminate" is used herein, this term is intended to denote all types of thermosetting resins and thermoplastic polymers presently used to construct PCBs, including but not limited to epoxies, bismaleimide triazine epoxy, cyanate esters, polyimides, polytetrafluoroethylene (PTFE) and other fluoropolymers, etc., whether or not they contain any fiber or filler.

Porous, metallic power and ground planes may be made in a number of ways. The most preferred method for making a porous, metallic power plane is to add a number of holes to the metal foil that is normally used in the PCB manufacturing process. By adding an array of holes to the metal foil, the metal foil will be relatively porous to water. It is preferred that such holes be sized between 0.001 and 0.010 inches in diameter and be spaced a maximum of 0.050 inches apart to provide adequate porosity to water or other solvents. The most preferred diameter is 0.002 inches, as this diameter can be made by common lithography and allows adequate power distribution with even less than 0.050 inch spacings. Smaller holes may have to be created through non-standard processes, such as laser drilling. In general, the minimum spacings between holes depends on electrical design requirements for current carrying ability. While other sizes and spacings will increase water/solvent transfer though power/ground planes, the spacings and sizes given will allow sufficient water transfer while not detracting too much from the electrical current distribution ability of the metal layer. Thus, these spacings and sizes are preferred.

The size and spacing of the holes may also be somewhat influenced by when and how the holes are added to the metal foil. The preferred stage to add holes to the metal laminate is at the imaging/etching steps. Imaging of power and ground planes is already performed to remove metal for clearance holes to which the PTH will not be connected. In addition, designs that have both digital and analog components on the same PCB usually have separate power and ground planes. The digital circuitry has one set of power and ground planes, while the analog components have another set of power and ground planes. The separation of these planes requires areas of the power/ground planes to be removed during imaging steps. Because imaging is already being performed during these steps, simple modifications to the imaging process will allow holes to be made to increase the porosity of the power/ground planes.

For instance, if photolithography is being used to remove portions of the planes, a photoresist is applied to the surface of the plane. As previously explained, the photoresist is exposed to ultraviolet (UV) light through a mask to create areas of exposed (polymerized) photoresist that will subsequently remain after the resist is developed. When unexposed photoresist has been removed, the underlying copper layer is uncovered. The uncovered areas of copper are then removed during etching, while the areas of copper covered by resist are protected from the etchant. To create an array or a plurality of holes in the copper layer, the mask can be changed to include a plurality of opaque areas that will create the array of holes in the laminate. How to change the mask to create the array depends on the type of processing being used. For instance, if positive photoresist is being used, the image on the mask will be an inverse of the mask used for the negative photoresist. Making masks to create patterns using particular photoresists is well known in the art. Photolithography has the benefit that fairly small holes may be produced.

Using screened ink to create a pattern on the surface of the layer is also well known in the art. The screen is similar to a mask in the sense that it blocks ink that is pushed through the screen and onto the layer. Thus, the image on the screen is the inverse (the negative) of the image that will be on the layer. The ink protects the layer from the etchant in a subsequent etching step; areas of the layer where there is no ink will be etched and the metal in these areas removed. If an array of holes in the metal foil is desired, an array of "islands" on the screen generally will be made. The islands on the screen will block the ink and create holes in the ink that is deposited on the surface of the layer. These holes in the ink will subsequently become holes in the metal laminate after etching is performed. Another processing step removes the ink following the etch. Screening to create a plurality of holes in the laminate has the detriment that larger holes must be created, as very small holes are difficult, if not impossible, to make with this method.

FIG. 1 shows a portion 200 of a power core that has been made in accordance with a preferred embodiment of the invention. Power core 200 comprises power plane 202 (a copper layer), dielectric layer 204 and ground layer 205 (a second copper layer). Power core 200 then (prior to drilling, etc.) is a normal CCL similar to power core 110 shown previously in FIG. 6. Photolithography and etching have been performed to make an array of porosity holes 220 and clearance holes 210, 250. Clearance holes 210 and 250 act to isolate power plane 202 or ground plane 205 from PTHs (or tooling holes). Porosity holes 220 have been arrayed in rows and columns that are relatively parallel. Location 260 indicates where a porosity hole 220 would have been in the array, but porosity hole 220 was too close to clearance hole 210 and was omitted. Although this example shows that a porosity hole 220 in location 260 was omitted, the reason for the omission is because there is already some porosity provided by clearance hole 210. The porosity hole that would have been in location 260 could be made if desired. Both clearance holes 210, 250 could be made through photolithographic processes during processing (although tooling holes could be made during tooling hole steps). Thus, porosity holes 220 could be made during the same photolithographic step as that used to make clearance holes 210, 250.

Figure 2:
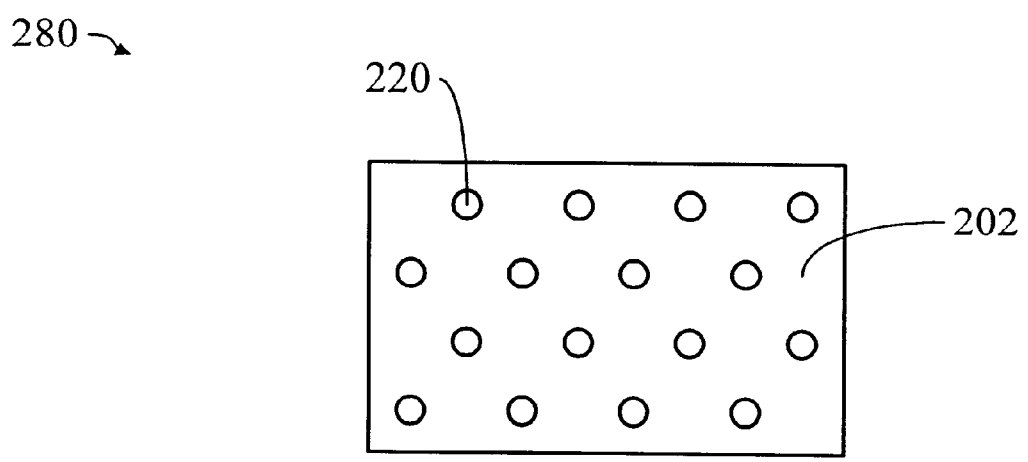
FIG. 2 is a top view of a power core patterned in accordance with another preferred embodiment of the present invention.

Although the array of holes 220 are shown in parallel rows and columns, other arrays are possible. For instance, the columns or rows could be staggered as shown in FIG. 2. FIG. 2 shows the top surface (copper layer 202) of a portion of a power core 280. The columns of holes 220 are along parallel lines, and the rows of holes 220 are also along parallel lines; however, the location of the holes along these lines is staggered or alternating.

In addition, although these examples discuss copper foil, it should be noted that this technique can also be applied to power plane conductors comprised of other metals and combinations of metals such as copper/invar/copper and copper/stainless steel/copper, etc.

Power cores that have an array of holes 220, such as power core 200, may be used as shown in FIG. 6 with little change in processing steps other than the described small changes to the photolithographic or screened ink steps.

As indicated above, other materials in addition to copper foil may be used to provide porous power or ground planes suitable for use in PCBs or LCCs. Some of these materials may be relatively brittle during drilling stages of PCB or LCC manufacturing. For instance, fibrous materials may be damaged more easily than metal foils during drilling. In addition, because photolithographic and etching techniques may not be able to pattern some of these porous power and ground planes, it is preferred that particular changes to normal PCB or LCC fabrication steps be made. Before proceeding to other materials that may be used for porous power and ground planes, general steps involved with using and making porous power/ground planes from porous material will be discussed.

Figure 3:
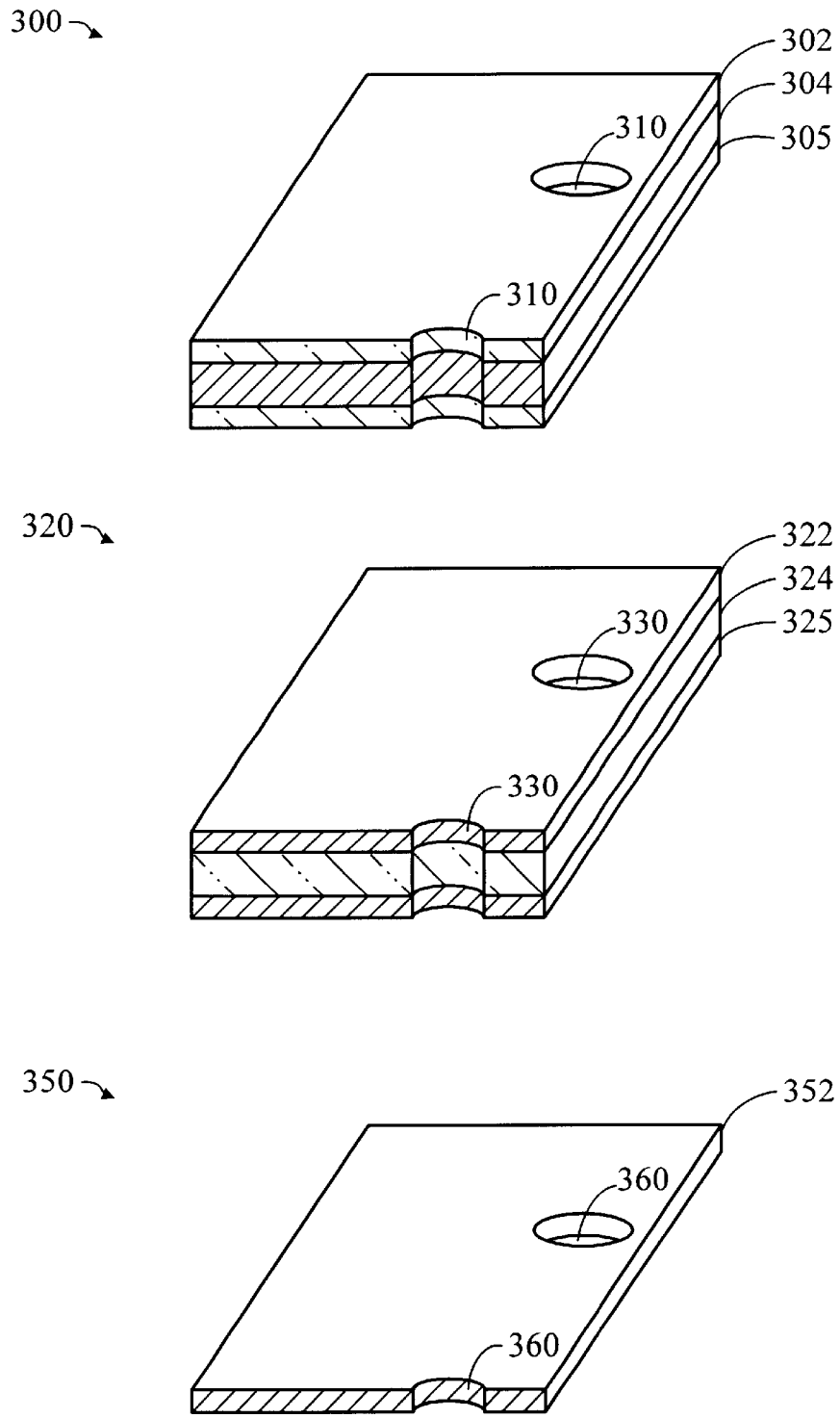
FIG. 3 is cross-sectional views of preferred power or ground planes for several embodiments of the present invention.

Turning now to FIG. 3, this figure illustrates three preferred configurations of porous power and ground planes. Each of these configurations entails slightly different processing steps to make and use a porous power or ground plane in a PCB/LCC. The most preferred configuration of a porous power and ground plane is shown as power/ground core 300. Power/ground core 300 comprises a porous plane 304 sandwiched between two layers of fiber laminate 302, 305. Two clearance holes 310 are shown; these holes have been drilled in power/ground core 300 to provide clearance for PTHs after power/ground core 300 has been laminated together with another power/ground core, and one or more signal cores. Laminating creates a composite that will subsequently be drilled and metallized to create a PCB or LCC. By laminating a porous plane 304 between two fiber laminate layers 302, 305, the fiber laminate layers provide protection for the porous plane during drilling and handling. Fiber laminate layers 302, 305 may be non-conductive or conductive. In the latter embodiment, power/ground core 300 would be a conductive composite. Power/ground core 300 could then be laminated between layers of non-conductive fiber laminate to create a larger "core", or power/ground core 300 could be laminated, along with other signal layers, power/ground cores, and non-conductive fiber laminate layers, into a PCB composite.

FIG. 3 also shows second and third less preferred configurations for porous power and ground planes that are more susceptible to drilling and handling damage. Power/ground core 320 comprises a layer of fiber laminate 324 sandwiched between two layers of porous planes 322, 325. Again, fiber laminate layer 324 can be conductive or non conductive. Power/ground core 320 has been drilled with clearance holes 330. Power/ground core 350 comprises a porous plane 352. Similarly, power/ground core 350 has been drilled with clearance holes 360. These are less preferred embodiments of power/ground cores because the porous plane is exposed to potential drilling and handling damage. However, if enough care is taken during handling and drilling, minimal or no damage to the porous materials making the power/ground planes might result. Encapsulating porous materials, which are susceptible to handling or drilling damages, in fiber laminate lessens the potential for damage and is, thus, preferred.

Each of these cores may be processed in a slightly different manner. In general, power/ground core 300 will be laminated after an optional adhesion promoting process (using chemicals such as silane) is performed on porous plane 304. Then the power/ground core will generally be drilled with clearance holes 310. Drilling is used at this stage in lieu of patterning with photoresist and etching because fiber laminate (in its dielectric or conductive configurations) in general cannot be etched. Additionally, clearance holes 310 may be filled with an insulator/dielectric at this step. The drilled power/ground core 300 can then be laminated into a composite with another power/ground core and one or more signal cores. The composite is then drilled and metallized (for PTHs) to form a PCB or LCC. Optionally, power/ground core 350 can be drilled, treated with an adhesion promoting process, then laminated with two sheets of fiber laminate into power/ground core 300. While mechanical drilling of power/ground core 350 is suitable for creating clearance holes and tooling holes, laser or other less damaging drilling is preferred for power/ground plane materials that are susceptible to drilling damage.

In general, power/ground core 320 may be formed by treating porous layers 322, 325 with an (optional) adhesion promotion process. A sheet of fiber laminate (conductive or non-conductive) is then laminated between the two porous layers. Drilling is usually performed next to create clearance (or tooling) holes 330. Preferably, laser or other less damaging drilling would be used for power/ground plane materials that are susceptible to drilling damage. Laser drilling has the additional advantage in this embodiment of patterning the two conductive, porous layers with different clearance hole patterns. Filling of clearance or tooling holes with insulating/dielectric material may be performed next. Power/ground core 320 may then be laminated into a composite along with another power/ground core and one or more signal planes.

In general, power/ground core 350 may be drilled, treated with an optional adhesion promoting material (such as a silane or copper oxide treatment), and laminated with two layers of fiber laminate (conductive or non-conductive) to form core 300. Optionally, power/ground core 350 can be drilled, treated with an adhesion promoting step, and then laminated into a composite with another power/ground core, several layers of fiber laminate, and one or more signal cores. For instance, to form a six-layer composite, the layers from "top" to "bottom" of the composite would be as follows: a signal core (such as signal core 101 of FIG. 6), one or more layers of fiber laminate, a power/ground core 352, one or more layers of fiber laminate, a power/ground core 352, one or more layers of fiber laminate, and a second signal core (such as signal core 130 of FIG. 6). This composite can then be drilled and metallized to create a PCB/LCC.

As previously discussed, it is preferred that conductive materials used for porous power or ground planes that are susceptible to drilling or handling damage be formed into a power/ground core wherein the porous conductive material is sandwiched or encapsulated between two layers of fiber laminate. Forming power or ground cores in this manner will provide support and protection for the porous conductive material during drilling steps. This protection reduces the amount of fibrous material that might be broken by the drilling process. A power core like power core 320 (similar to power core 110 of FIG. 6) or power core 350 may also be made, but drilling and/or handling might cause some splintering and cracking of the porous material. Additionally, loose fibrous material may contaminate some processing steps. By encapsulating the fibrous material and adding insulator/dielectric into drilled holes, the fibrous material is less likely to contaminate subsequent processing steps.

Figure 4:
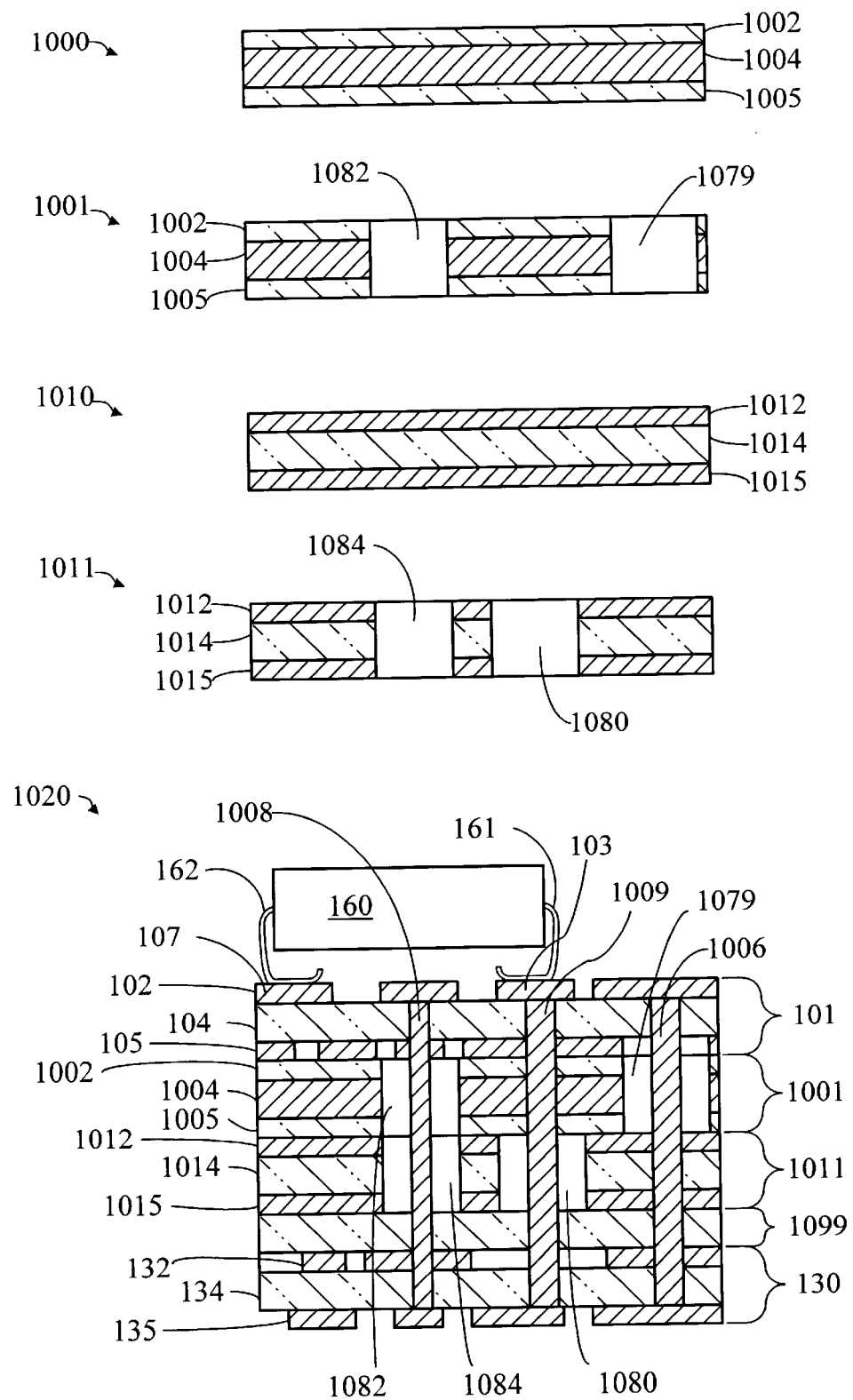
FIG. 4 is cross-sectional views of a six-layer printed circuit board and the layers that make up a six-layer printed circuit board in accordance with a preferred embodiment of the present invention.

Referring now to FIG. 4, several cross-sectional views of power and ground cores are shown, along with a six layer PCB/LCC made with these cores. FIG. 4 is an example illustrating a power core 1000, a drilled power core 1001, a ground core 1010, a drilled ground core 1011, and a six-layer PCB/LCC 1020. Power core 1000 was formed by performing an adhesion promoting process on porous power plane 1004, then laminating this plane with two layers of dielectric 1002 and 1005. Power core 1000 was then drilled to create clearance holes 1082 and 1079. A "normal" CCL power core would be etched, after a photoresist mask has been applied, to create an imaged power core (i.e., power core 111 of FIG. 6). Because etching may not be possible on some of the porous, conductive materials used for power/ground planes or on fiber lamination, drilling is the preferred method of creating clearance holes. Power core 1000 and 1001 in this example is essentially a porous, conductive layer sandwiched between two non-conducting fiber laminates. Ground core 1010 was formed by performing an adhesion promoting process on porous ground planes 1012, 1015, then laminating these planes on both sides of a layer of conductive fiber laminate. Ground core 1010 was then drilled to create clearance holes 1084 and 1080. Ground core 1010 in this example is essentially one conductive plane having three conductive layers (one layer of conductive fiber laminate sandwiched between two layers of porous, conductive materials). Although not shown in FIG. 4, dielectric or other insulator may be added to power core 1001 and ground core 1011 to fill the clearance holes in these cores.

Concerning conductive fiber layer 1014, a preferred method of making this layer is to add 40 percent by volume of copper powder to a fiber or fiber/resin layer. During lamination, the copper should be distributed evenly throughout the fiber layer. Other conductive fillers may be used, along with other types of layer materials, but this filler and layer material has the benefits of being relatively inexpensive and being commonly used in PCB manufacturing.

After the cores have been drilled (and insulator added, if desired), power core 1001 and ground core 1011 are then pressed together, along with patterned signal cores 101, 130 and fiber laminate layer 1099, to form a composite. This composite is drilled and metallized to create PTHs. After attaching components to the PCB/LCC, exemplary six layer PCB/LCC portion 1020 results. Fiber laminate layer 1099 is a non-conductive, dielectric layer used to isolate signal plane 132 from ground core 1011, and in particular porous plane 1015 of ground core 1011. There is an equivalent fiber laminate layer between power core 1001 and ground core 1011 to adhere these planes together.

PTH 1008, similar to PTH 108 of FIG. 6, connects lines of signal layers 102 and 105 of signal core 101 with lines of signal layers 132 and 135 of signal core 130. Clearance areas 1082 and 1084 prevent ground and power layers from contacting the PTH. Although clearance areas 1082 and 1084 are shown filled with "air," in reality these areas will usually be filled with dielectric: either the areas were filled with dielectric (or another insulator) after drilling the power or ground core, or the areas will be filled with dielectric/insulator during lamination.

PTH 1009, similar to PTH 109 of FIG. 6, joins pad 103 and a line on layer 135 of signal core 130 with power plane 1001. Clearance area 1080 prevents PTH 1009 from connecting to ground core 1011. Similarly, PTH 1006, similar to PTH 106 of FIG. 6, joins lines on layer 102 of signal core 101 and on layers 135, 132 of signal core 130 with ground core 1011. In this example, ground core 1011 comprises three conductive layers (two porous planes 1012 and 1015, and one conductive fiber laminate 1014), all of which are connected to PTH 1006. Clearance area 1079 prevents PTH 1006 from connecting to power layer 1004.

In the example of FIG. 4, most fiber laminate layers separating the various cores are shown as being relatively thin. For instance, fiber laminate layers 1002, and 1005 are thin. This is for representation only, as those skilled in the art realize that more layers, thinner, or thicker layers of fiber laminate may be added if needed. Comparing six layer PCB/LCC 1020 of FIG. 4 with six layer PCB/LCC 120 of FIG. 6, there are few differences other than PCB/LCC 1020 has separate power and ground cores. PCB/LCC 1020 also has porous power and ground planes that allow water or other solvents to freely disperse through the various layers comprising PCB/LCC 1020. Porous power and ground planes limit failures caused by cathodic/anodic filament (CAF) growth and delamination of insulators.

Figure 5:
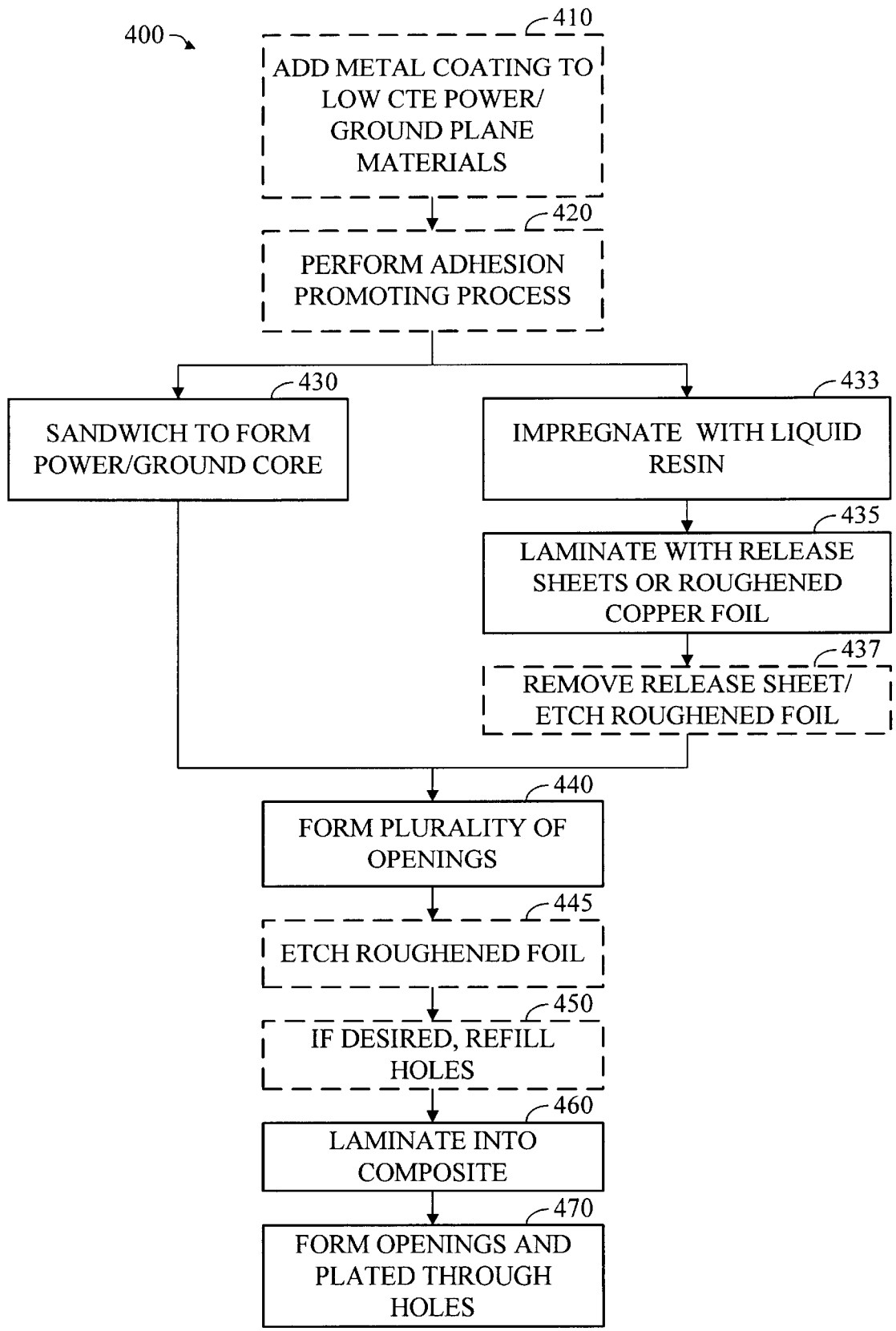
FIG. 5 is a process flow chart of a method for making and using a power or ground plane in accordance with a preferred embodiment of the present invention.

A preferred method of forming a power or ground core (such as power core 1000) containing porous conductive material in accordance with the current invention is shown in FIG. 5. Method 400 of FIG. 5 is preferably used to form both the power and ground cores and to combine the power and ground cores into a composite PCB or LCC. This method is also used for the preferred embodiments wherein porous conductive material is sandwiched between two layers of fiber laminate, as in power plane 1000. This embodiment allows more protection for the internal porous, conductive material. In addition, fiber laminate can help "seal" metal-covered fibrous materials and other loose materials, which helps to keep the fibrous material internal to the laminate. This is particularly helpful in the case of carbon materials, which could potentially contaminate portions of the PCB/LCC and the manufacturing process. Method 400 begins when an optional thin layer of metal coating is made over the porous material being used (step 410). The metal-clad fibrous materials of the present invention generally have enough metal to carry the required current; if additional current carrying capacity is needed, more metal may be formed on the fibers in step 410.

Additionally, if the preferred porous materials of the present invention have not been metallized, then the materials can also be metallized in this step. For instance, if an non-metallized carbon fiber tow is being used as the porous material, the tow could be metallized and then formed into a woven fabric in step 410. The fabric could then have additional metal added onto the fabric, if desired, in step 410. In short, step 410 may be used both to metallize those materials that are not coated with metal and to add additional metal to materials that are already coated with metal. The types of preferred materials to be used for power and ground planes will be discussed in detail after method 400 is discussed.

The porous material is then optionally treated with an adhesion promoting chemical process or copper oxide treatment (step 420). Next, the conductor is laminated or sandwiched between fiber laminate (step 430) to form an encapsulated, porous power or ground core. In general, standard lamination processes will be used to laminate the porous ground/power material. Alternatively, the fibrous, porous materials may be impregnated with resin using a standard impregnation process (step 433). This standard impregnation process essentially encapsulates the fibrous material. The resin impregnated cloth is then laminated against a release sheet or a roughened copper foil. If a roughened foil is used, it can either be etched off (step 437) or left on through drilling (step 440). The release sheet will generally be removed (step 435) prior to drilling.

Because fiber laminate generally cannot be etched to form the necessary electrical clearance holes (and other openings), these openings are formed in the power/ground core (step 440). Generally, the openings will be formed by drilling the clearance hole pattern or tooling holes into and through the laminate and porous plane. Drilling can either be done by mechanical drills or by use of a laser or other similar hole-making apparatuses. If roughened foil had been laminated on the porous material (step 435) and not removed (in step 437), it is now removed by etching (step 445). At this point, the openings can be refilled with pure resin, resin containing a non-conductive filler, or other appropriate insulator/dielectric (step 450). The power/ground core can be incorporated into a composite, preferably by re-laminating or pressing into a composite board structure (step 460). Extra resin from fiber laminate flows into and fills the drilled power plane holes during the lamination cycle if the holes were not filled in step 450. Re-drilling to create the holes used for PTHs, and metallization of these holes, may be performed next (step 470). After step 470, a PCB/LCC similar to PCB/LCC 1020 should exist.

While method 400 is the preferred method for making PBCs or LCCs with porous power/ground planes, the steps in method 400 may change slightly depending on the configuration of power/ground core used. For instance, two layers of porous, conductive material can be laminated on a fiber laminate, such as previously shown in power and ground core 320 of FIG. 3. In this embodiment, the processing steps remain very similar to those shown in method 400. For example, steps 410 and 420 of method 400 may be performed to add additional metal to the conductive material and to promote adhesion, respectively. A sheet of fiber laminate (conductive or non-conductive) could then be laminated between the two porous layers. Drilling is then usually performed to create clearance or tooling holes (step 440). Preferably, laser or other less damaging drilling would be used for power/ground plane materials that are susceptible to drilling damage. Laser drilling has the additional advantage in this embodiment of patterning the two conductive, porous layers with different clearance hole patterns. Filling of clearance or tooling holes with insulating material may be performed at this stage (step 450). Power/ground core 320 may then be pressed into a composite (step 460) along with another power/ground core, one or more signal planes, and non-conductive fiber laminate layers. Then, the composite will be drilled and metallized to create a PCB/LCC (step 470).

In addition, a power/ground core similar to power/ground core 350 of FIG. 3 may also be used to create a power or ground plane. In this embodiment, the processing steps used to create a power and ground plane differ somewhat from method 400. For example, drilling (step 440) could take place before or after step 410 (if performed). The porous conductive plane then might be treated with an optional adhesion promoting material (step 420), and laminated with two layers of fiber laminate (conductive or non-conductive) to form core 300 of FIG. 3. In this embodiment, step 450 will generally be unnecessary, as the lamination process should fill the holes with fiber laminate. Optionally, a porous, conductive plane similar to power/ground core 350 can be drilled, treated with an adhesion promoting step (step 420), and then pressed into a composite (step 460) with another power/ground core, several layers of fiber laminate, and one or more signal cores. This composite can then be drilled and metallized to create a PCB/LCC (step 470).

Finally, method 400 is applicable to other configurations of PCBs in addition to six-layer PCBs as shown in FIG. 4. A higher or lower number of layers may be formed by adapting the processes of method 400 to that particular number of layers. For instance (referring back to FIG. 4), if a four layer PCB is desired, a power core 1000 could be laminated on the outer surface of 1002 with a copper laminate. Then drilling could form a power core 1001. Similarly, a ground core 1010 could be laminated on the outer surface of 1015 with a fiber laminate and a copper laminate. Then drilling could form the ground core 1011. The openings created in the power and ground cores during drilling could be filled with insulator. The two copper laminate layers could then be patterned and the two power and ground cores formed into a composite. Drilling and plating for PTHs could be performed to create a PCB. Alternatively, drilled power core 1001 and drilled ground core 1011 could be formed into a composite with layers in the following order: a copper layer, an optional non-conductive fiber laminate layer, power core 1001, ground core 1011, a non-conductive fiber laminate layer, and a copper layer. Then the two copper layers could be patterned into signal layers and the composite drilled and metallized to create a four-layer PCB.

The manners of using porous materials to make porous, conductive power and ground planes have now been discussed in a general sense. These methods and materials may be used with any of the particular porous, conductive materials discussed below. If there are any additional processing steps that are preferred for use in order for a material to be formed as a power or ground core, these steps will be discussed in relation to the power/ground material.

A preferred material suitable for use in metallic power and ground planes is sintered metal. Sintered metal is formed of metal particles that are bonded together under pressure and heat. Sintered metal power planes may be formed by pressing high melt temperature, high electrical conductivity metal particles (such as copper) coated with a low melt metal (such as tin) together under heat and pressure. The tin-coated copper particles fuse together to form an electrically conductive but porous sheet.

This conductive sheet may be used to make a power/ground core similar to power/ground core 300, 320, or 350. Additionally, any of the previously discussed methods for making these cores and integrating them into a PCB/LCC may be performed.

Additional preferred materials for creating porous, conductive power and ground planes may be loosely referred to as fibrous conductive materials. These preferred additional materials include small wires formed into a sheet (or "fabric"), metallized fabrics (such as polyester), metallized carbon fiber fabric, and metallized glass fibers. Fabrics can further be broken into woven fabric (fabrics having some non-random structure) and random paper fabrics. Random paper fabrics are generally made from fibers placed in random orientations.

For instance, a preferred "fabric" material used to create porous power/ground planes is metal wires that are formed into a woven fabric sheet or a random paper fabric sheet. It is preferred that wires comprising the sheet be made in small diameters to allow for thin sheets. It is also preferred that the wire diameter be large enough to carry the expected current for the application. Metal layers of non-woven small wires may also be used as a material for porous power and ground planes. In addition, woven fabric sheets or random paper fabric sheets should also undergo an over-plating process to better electrically connect the wires at each intersection. This will ensure better conductivity between the individual "fibers."

These conductive sheets of metal wires may be used to make a power/ground core similar to power/ground core 300, 320, or 350. Additionally, any of the previously discussed methods for making these cores and integrating them into a PCB/LCC may be performed.

An additional metallized fibrous material suitable for use as a power or ground plane in PCBs is metal-coated organic fibers such as liquid crystal polymers (LCPs) (for example, aramid, made by DuPont; VECTRAN, made by Hoechst-Celanse), and other fabrics like polyester, SPECTRA (which is a polyethylene made by Allied Signal), and nylon. Aramid and other LCP fibers are preferred due to their low coefficients of thermal expansion (which will be discussed below) and thermal stability. Polyester is also a preferred fiber because it is a monofilament (in its woven state) and is less susceptible to handling damage. These materials may be purchased in woven and random paper fabrics.

While some of these organic fibrous materials may be purchased as coated fabric, metal-coated organic fibrous material suitable for use as a power or ground plane may be also made by the following steps. First, the organic fibrous material is placed into a chamber and held in a slightly stretched and/or flat position. Having the material stretched or flattened ensures that metal will evenly cover exposed surfaces. Metal is then deposited on the organic fibrous material. Such deposition may be performed in a number of manners, including plating, sputtering, evaporation, or chemical vapor deposition. If desired or necessary by the process, the organic fibrous material may be turned over and more metal deposited. For instance, if sputtering is used, metal will usually be deposited only on one surface of the fabric. While the fabric may be used in this format, more metal will generally be added on the other side of the fabric to increase the current-carrying capabilities of the fabric. Alternatively, the fabric may be sputtered on both sides simultaneously using a roll-to-roll format. After sputtering or chemical vapor deposition, even more metal may be added to the fabric by means of conventional plating. This additional metal will increase the current carrying capacity of the metal fabric power/ground planes.

Once formed into a metallized fibrous sheet, these porous, conductive sheets may be used to make a power/ground core similar to power/ground core 300, 320, or 350. Additionally, any of the previously discussed methods for making these cores and integrating them into a PCB/LCC may be performed.

Another preferred metallized fibrous material suitable for use as a power or ground plane in PCBs or LCCs is metal-coated carbon fibers. Because carbon fiber comes both as woven fabric and as yarn strands, metallization of the fiber may occur in both states. For instance, metal may be deposited onto carbon fiber fabric. Alternatively, metal may be deposited onto carbon fiber yarn and the carbon fiber yarn woven into cloth or fabric. Carbon fiber may be bought already coated with metal and already formed into a tow. This tow can then be used to weave a relatively flat fabric. In addition, carbon fiber may be bought in a random paper sheet.

Once formed into a metallized fibrous sheet, these porous, conductive sheets made of metallized carbon fiber may be used to make a power/ground core similar to power/ground core 300, 320, or 350. Additionally, any of the previously discussed methods for making these cores and integrating them into a PCB/LCC may be performed.

Another preferred embodiment that is fibrous is metallized glass fibers. As with carbon fiber, glass may be bought as individual fiber yarn or as sheets of woven fiber. The individual strands may be metallized and then woven into fabric, or the woven sheets of fiber may be metallized. Currently, these fibers cannot be purchased with metal coatings. To create a metal coated fiber or fabric, the methods previously described may be used to create fibers coated with metal, or woven fabrics coated with metal. In addition, glass fiber sheets may be purchased that are in random paper format. These sheets can be metallized using the previously discussed methods of metal deposition.

Once formed into a metallized fibrous sheet, these porous, conductive sheets made of metallized glass fibers may be used to make a power/ground core similar to power/ground core 300, 320, or 350. Additionally, any of the previously discussed methods for making these cores and integrating them into a PCB/LCC may be performed.

It should be noted that some fibrous materials used as power and ground planes in the present invention also have low Coefficient of Thermal Expansions (CTEs). A low coefficient of thermal expansion for the power/ground plane can lower the "total" CTE of PCBs or Laminated Chip Carriers (LCC). This has the benefit, particularly for LCCs, of preventing attached chips from cracking. In addition, low CTE power/ground planes have other benefits that are outlined in copending application EN9-98-010, "LOW CTE POWER AND GROUND PLANES."

Although copper has been mainly discussed as the metallization metal, those skilled in the art will realize that techniques used to deposit copper may also be used to deposit silver, gold, aluminum, tin, etc. In addition, even if copper is used as the base metal for metallization, additional amounts of other metals may be added at certain processing steps. For instance, some manufacturers will add small amounts of gold during processing to enhance the conductivity of base connections.

Thus, the preferred embodiments create porous, conductive materials that may be used as ground and power planes in PCBs. These materials should reduce common PCB problems such as delamination and cathodic/anodic filament growth that are caused by water and/or other solvents. The reduction in these problems should reduce PCB defects and increase PCB reliability. This is particulary true for chip carriers, which must have more rigorous moisture resistance.

While the invention has been particularly shown and described with reference to exemplary embodiments of porous power and ground planes for PCBs, those skilled in the art will recognize that the preferred embodiment can be applied to other applications where porous, conductive, and planar material is desirable, and that various changes in form and details may be made therein without departing from the spirit and scope of the invention.

What is claimed is:

1. A power/ground core for use in printed circuit boards, the power/ground core comprising: a first non-conductive water-permeable layer of first fiber laminate; and a first metal sheet that includes a two-dimensional distribution of through holes formed therethrough, wherein the first non-conductive layer is in surface contact with the first metal sheet, wherein the first metal sheet is water permeable only through its through holes, wherein the through holes in the first metal sheet do not extend into the first non-conductive layer, wherein the through holes in the first metal sheet have spacings therebetween, and wherein the spacings and diameters of the through holes in the first metal sheet are sufficient to permit water in the first non-conductive layer to pass through the through holes in the first metal sheet sufficiently fast so as to prevent the water in the first non-conductive layer from collecting at the interface between the first non-conductive layer and the first metal sheet.

2. The power/ground core of claim 1, further comprising a second metal sheet that includes a two-dimensional distribution of through holes formed therethrough, wherein the first non-conductive layer is in surface contact with the second metal sheet such that the first non-conductive layer is disposed between the first and second metal sheets, wherein the second metal sheet is water permeable only through its through holes, wherein the through holes in the second metal sheet do not extend into the first non-conductive layer, wherein the through holes in the second metal sheet have spacings therebetween, and wherein the spacings and diameters of the through holes in the second metal sheet are sufficient to permit water in the first non-conductive layer to pass through the through holes in the second metal sheet sufficiently fast so as to prevent the water in the first non-conductive layer from collecting at the interface between the first non-conductive layer and the second metal sheet.

3. The power/ground core of claim 1, further comprising a second water-permeable non-conductive layer of second fiber laminate, wherein the second non-conductive layer is in surface contact with the first metal sheet such that the first metal sheet is disposed between the first and second non-conductive layers, and wherein the through holes in the first metal sheet do not extend into the second non-conductive layer, and wherein the spacings and diameters of the through holes in the first metal sheet are sufficient to permit water in the second non-conductive layer to pass through the through holes in the first metal sheet sufficiently fast so as to prevent the water in the second non-conductive layer from collecting at the interface between the second non-conductive layer and the first metal sheet.

4. The power/ground core of claim 1, wherein the two-dimensional distribution of the through holes in the first metal sheet is arrayed in parallel rows and parallel columns.

5. The power/ground core of claim 4, wherein a row of the rows and a column of the columns make an angle with each other, and wherein the angle differs from 90 degrees.

6. The power/ground core of claim 4, wherein the through holes in the first metal sheet are uniformly spaced in each row and in each column.

7. The power/ground core of claim 4, wherein the through holes in a first row of the rows or in a first column of the columns are staggered with respect to the through holes in a second row of the rows or in a second column of the columns, respectively.

8. The power/ground core of claim 1, wherein the through holes in the first metal sheet are spaced no greater than 0.05 inches apart.

9. The power/ground core of claim 1, wherein the through holes in the first metal sheet are at least 0.001 inch in diameter but less than 0.010 inch in diameter.

10. The power/ground core of claim 3, wherein a clearance hole extends through the first non-conductive layer, the first metal sheet, and the second non-conductive layer, and wherein the diameter of the clearance hole exceeds the diameter of the through holes of the first metal sheet.

11. The power/ground core of claim 1, wherein the first fiber laminate comprises a material selected from the group consisting essentially of epoxy, bismaleimide triazine epoxy, cyanate ester, polyimide, polytetrafluoroethylene (PTFE), polytetrafluoroethylene, and fluoropolymer.

12. A power/ground core for post-production use in printed circuit boards, the power/ground core comprising: a first non-conductive water-permeable layer of a first fiber laminate; and a first conductive layer that does not include a metal sheet having a through hole formed therethrough, wherein the first non-conductive layer is in surface contact with the first conductive layer, and wherein the first conductive layer comprises a first conductive material that is sufficiently porous to permit water in the first non-conductive layer to pass through the first conductive layer via the first conductive material sufficiently fast so as to prevent the water in the first non-conductive layer from collecting at the interface between the first non-conductive layer and the first conductive layer.

13. The power/ground core of claim 12, further comprising a second conductive layer that does not include a metal sheet having a through hole formed therethrough, wherein the first non-conductive layer is in surface contact with the second conductive layer such that the first non-conductive layer is disposed between the first and second conductive layers, and wherein the second conductive layer comprises a second conductive material that is sufficiently porous to permit water in the first non-conductive layer to pass through the second conductive layer via the second conductive material sufficiently fast so as to prevent the water in the first non-conductive layer from collecting at the interface between the first non-conductive layer and the second conductive layer.

14. The power/ground core of claim 12, further comprising a second non-conductive water-permeable layer of second fiber laminate, wherein the second non-conductive layer is in surface contact with the first conductive layer such that the first conductive layer is disposed between the first and second non-conductive layers, and wherein the first conductive material is sufficiently porous to permit water in the second non-conductive layer to pass through the first conductive layer via the first conductive material sufficiently fast so as to prevent the water in the second non-conductive layer from collecting at the interface between the second non-conductive layer and the first conductive layer.

15. The power/ground core of claim 12, wherein a clearance hole extends through the first non-conductive layer and the first metal sheet.

16. The power/ground core of claim 12, wherein a via filled with insulating material extends through the first non-conductive layer and the first metal sheet.

17. The power/ground core of claim 13, wherein a clearance hole extends through the first metal sheet, the first non-conductive layer, and the second metal sheet.

18. The power/ground core of claim 13, wherein a via filled with insulating material extends through the first metal sheet, the first non-conductive layer, and the second metal sheet.

19. The power/ground core of claim 14, wherein a clearance hole extends through the first non-conductive layer, the first metal sheet, and the second non-conductive layer.

20. The power/ground core of claim 14, wherein a via filled with insulating material extends through the first non-conductive layer, the first metal sheet, and the second non-conductive layer.

21. The power/ground core of claim 14, wherein the first fiber laminate comprises a first material selected from the group consisting essentially of epoxy, bismaleimide triazine epoxy, cyanate ester, polyimide, polytetrafluoroethylene, polytetrafluoroethylene, and fluoropolymer, and wherein the second fiber laminate comprises a second material selected from the group consisting essentially of epoxy, bismaleimide triazine epoxy, cyanate ester, polyimide, polytetrafluoroethylene, polytetrafluoroethylene, and fluoropolymer.

22. The power/ground core of claim 12, wherein the first conductive material comprises sintered metal.

23. The power/ground core of claim 12, wherein the first conductive material comprises a first fibrous material woven into a fabric or formed into random paper fabric.

24. The power/ground core of claim 23, wherein the first fibrous material is selected from the group consisting essentially of metal-coated carbon fiber, metal-coated polyester, metal-coated liquid crystal polymers, metal-coated polyethylene, metal-coated glass fibers, and metal wires.

25. The power/ground core of claim 12, wherein the first fiber laminate comprises a material selected from the group consisting essentially of epoxy, bismaleimide triazine epoxy, cyanate ester, polyimide, polytetrafluoroethylene (PTFE), polytetrafluoroethylene, and fluoropolymer.

26. The power/ground core of claim 13, wherein the first conductive material comprises a first fibrous material woven into a fabric or formed into random paper fabric, and wherein the second conductive material comprises a second fibrous material woven into a fabric or formed into random paper fabric.

27. The power/ground core of claim 26, wherein the first fibrous material is selected from the group consisting essentially of metal-coated carbon fiber, metal-coated polyester, metal-coated liquid crystal polymers, metal-coated polyethylene, metal-coated glass fibers, and metal wires, and wherein the second fibrous material is selected from the group consisting essentially of metal-coated carbon fiber, metal-coated polyester, metal-coated liquid crystal polymers, metal-coated polyethylene, metal-coated glass fibers, and metal wires.

28. The power/ground core of claim 3, wherein a via filled with insulating material extends through the first non-conductive layer, the first metal sheet, and the second non-conductive layer, and wherein the diameter of the via exceeds the diameter of the through holes of the first metal sheet.

* * * * *